(12) United States Patent
Gopisetty et al.

(10) Patent No.: US 6,292,927 B1
(45) Date of Patent: Sep. 18, 2001

(54) REDUCTION OF PROCESS ANTENNA EFFECTS IN INTEGRATED CIRCUITS

(75) Inventors: Runip Gopisetty, Los Altos; Neeraj Dogra, Sunnyvale, both of CA (US)

(73) Assignee: Artisan Components, Inc., Sunnyvale, CA (US)

( * ) Notice: Subject to any disclaimer, the term of this patent is extended or adjusted under 35 U.S.C. 154(b) by 0 days.

(21) Appl. No.: 09/207,159

(22) Filed: Dec. 7, 1998

(51) Int. Cl.[7] .................................................. G06F 17/50
(52) U.S. Cl. ................... 716/11; 716/21; 716/8; 716/121; 716/13
(58) Field of Search ................................................ 716/11

(56) References Cited

U.S. PATENT DOCUMENTS

| 5,393,701 | * | 2/1995 | Ko et al. ............................... 437/193 |
| 5,434,108 | * | 7/1995 | Ko et al. ............................... 437/228 |
| 5,514,623 | * | 5/1996 | Ko et al. ............................... 437/189 |
| 5,702,566 | * | 12/1997 | Tsui ..................................... 156/643.1 |
| 5,900,664 | * | 5/1999 | En ......................................... 257/356 |
| 5,901,065 | * | 5/1999 | Guruswamy et al. ................ 364/491 |
| 5,910,030 | * | 6/1999 | Hollander et al. .................... 439/620 |
| 5,910,452 | * | 6/1999 | Kang et al. ............................ 438/710 |
| 5,963,412 | * | 10/1999 | En ......................................... 361/111 |
| 5,984,510 | * | 11/1999 | Guruswamy et al. ................ 364/491 |
| 5,987,086 | * | 11/1999 | Raman et al. .................... 375/500.02 |
| 5,994,225 | * | 11/1999 | Liu et al. .............................. 438/694 |
| 6,006,024 | * | 12/1999 | Guruswamy et al. .......... 395/500.13 |
| 6,028,324 | * | 2/2000 | Su et al. ................................. 257/48 |
| 6,091,114 | * | 7/2000 | Mogul et al. ......................... 257/360 |
| 6,097,139 | * | 8/2000 | Tuck et al. ............................ 313/310 |
| 6,191,020 | * | 2/2001 | Liu et al. .............................. 438/597 |

OTHER PUBLICATIONS

W. Maly et al., Detection of an Antenna Effect in VLSI Designs, 1996 IEEE International Symposium on Defect and Fault Tolerance in VLSI Systems, pp. 86–94, Nov. 1996.*
H. Shirota et al., A New Router for Reducing Antenna Effect in ASIC Designs, IEEE Proceedings of 1998 Custom Integrated Circuits Conference, pp. 601–604, May 1998.*
C. Chen et al., The Layout Synthesizer: An Automatic Netlist to Layout System, 26th ACM/IEEE COnference on Design Automation, pp. 232–238, Jun. 1989.*
Dracula—The Physical Verification Standard: Datasheet [online]. Cadence Corporation. [retrieved on Nov. 2, 2000]. Retrieved from the Internet:<http://www.cadence.com/datasheets/dracula.html, Jan. 1991.*

* cited by examiner

Primary Examiner—Matthew Smith
Assistant Examiner—A. M. Thompson
(74) Attorney, Agent, or Firm—Martine & Penilla, LLP

(57) ABSTRACT

An approach for reducing antenna effects in integrated circuits involves evaluating an integrated circuit design to identify one or more problem interconnects that satisfy certain antenna effect criteria. The problem interconnects are selectively connected to one or more discharge paths and the integrated circuit design is updated to reflect the connections to the one or more discharge paths.

36 Claims, 6 Drawing Sheets

REDUCTION OF PROCESS ANTENNA EFFECTS IN INTEGRATED CIRCUITS

FIELD OF THE INVENTION

The invention relates to integrated circuits, and more specifically, to reducing process antenna effects in integrated circuits.

BACKGROUND OF THE INVENTION

Integrated circuits are typically fabricated from one or more layers of different materials. Some layers, such as polysilicon layers, are used to form semiconductor devices while other layers, such as patterned metal layers, provide electrical connections between semiconductor devices. Typical integrated circuits include multiple patterned metal layers, with intervening inter-level dielectric layers for electrically insulating the metal layers.

It is well known that certain processes used in semiconductor fabrication, particularly plasma processing, can cause charging of conductor films formed on a wafer surface. For example, polysilicon or metal interconnect structures are known to be particularly susceptible to charge buildup during plasma etching. This phenomenon is sometimes referred to as the "antenna effect" and is believed to be caused by non-uniformities in the plasma across the wafer surface. In some circumstances the charge buildup can damage thin oxides under the interconnect structures, either by shorting or sufficiently weakening the oxides so that they fail during normal device operation. Because of its adverse effects on yield, antenna effects are a critical issue in semiconductor processing.

There are several prior approaches for reducing antenna effects in semiconductor processing. Two prior approaches include changing the processing used to fabricate an integrated circuit and changing the design of an integrated circuit. Examples of changing the processing of an integrated circuit include reducing the excitation frequency, modifying the electrode design of a plasma etcher, eliminating highly electromagnetic gases such as $SF_6$ from the etch process, modifying the oxide cleaning process and selecting an oxide growth process that yields an oxide that is less susceptible to charging damage. Often several combinations of processing changes are required to provide a significant reduction in antenna effects.

A significant limitation of this approach is that it can be difficult to find a single processing solution that significantly reduces antenna effects under all circumstances because process-induced damage is highly dependent on the particular processing step in which it is implemented. Thus, a processing solution may comprise numerous incremental processing improvements that do not necessarily provide a substantial reduction in antenna effects.

Changing the design of an integrated circuit to reduce antenna effects typically involves changing the layout of an integrated circuit. In the context of integrated circuit design, a "layout" is a set of geometric patterns, typically polygons, that specify the size and location of different types of material used to create semiconductor devices and electrical connections between the devices during fabrication of an integrated circuit. For example, a diffusion window on an integrated circuit may be represented in a layout by one or more polygons which are interpreted by a fabrication facility to mean "diffusion layer geometry." Other layers of material and features, such as contacts and vias, may also be similarly represented in an integrated circuit layout. The polygons in an integrated circuit layout must meet a set of design rules which define minimum sizes for certain types of material as well as minimum spacing requirements between different types of material. The design rules also specify size and spacing requirements for other layout features such as contacts. In contemporary semiconductor fabrication, integrated circuit layouts are often generated using computer-aided design (CAD) software. Thus, changes to an integrated circuit layout can be made to a data representation of the integrated circuit layout using CAD software.

There are several types of design changes that can be made to reduce antenna effects in an integrated circuit. One type of design change involves providing a discharge path for each device input in the integrated circuit. A discharge path is typically created by connecting a device input through a diode to ground, although other types of discharge paths may be used. Gate array implementations often have unused transistors that can be used for this purpose. As is well known in the art, an unused transistor is easily converted into a diode by connecting the gate to either the drain or source. An interconnect is then added from each device input through an available diode to ground.

The approach of connecting each device input to a discharge path in an integrated circuit layout to reduce antenna effects can have several adverse consequences. First, design costs can increase significantly because every cell in the integrated circuit layout has to be modified and tested. Furthermore, gate arrays do not always have enough unused transistors for the additional discharge paths, requiring that additional devices be added to the integrated circuit layout. These additional devices increase the size of the integrated circuit which is highly undesirable. This problem is even more acute for standard cells that do not ordinarily have any unused transistors. This problem is further exacerbated in custom designs because adding devices can require the entire place and route phase to be repeated. Even if additional devices do not have to be added to the integrated circuit layout, the additional routing attributable to the discharge paths can cause changes to the existing routing, and in some cases increase the size of the layout. Finally, circuit performance can be adversely affected by the additional capacitances attributable to the devices and interconnects.

Another type of design change involves limiting the length of interconnects to keep antenna effects within acceptable limits. As is well known, the amount of charge buildup on a particular interconnect depends on the total area of the particular interconnect. Consequently, during routing, interconnects that exceed acceptable total area limits are segmented and some of the segments moved to a different (higher) metal level. The segments are connected with vias to re-form the interconnects on different levels. However, each segment is short enough to avoid violating the antenna effect limit.

For example, suppose after the place and route phase for an integrated circuit layout that a particular interconnect on metal level three (M3) exceeds the acceptable antenna effect limits. The particular interconnect is divided into three segments, two end segments and a middle segment. The middle segment is moved to metal level four (M4) while the two end segments remain on M3. Two vias are used to connect the middle segment to each of the end segments. The result is an interconnect with three segments where none of the three segments individually violates the antenna effect limit. For longer interconnects, more segments may be required.

Although limiting the length of interconnects can significantly reduce antenna effects in integrated circuits, it is not without its disadvantages. First, this approach can require substantial re-routing of an integrated circuit and in some circumstances the segmentation can cause routing conflicts that ultimately require additional routing to resolve, increase the size of an integrated circuit. For example, in some situations there isn't enough available space in the layout for the new routing. As a result, the routing on other levels may have to be changed to free up space for the new routing. Moreover, the additional vias required to connect the segments can cause the routing to be changed and also increase the size of the integrated circuit because the via landing pads are wider than the interconnects. For example, two parallel interconnects with vias must be spaced farther apart than two similar parallel interconnects without vias. Thus, portions of the integrated circuit may need to be re-routed to accommodate the additional vias. In addition to affecting the routing and size of the integrated circuit, the capacitances associated with the additional vias can adversely affect the performance of an integrated circuit.

Accordingly, based upon the need to reduce process antenna effects in integrated circuits and the limitations in prior approaches, an approach for reducing process antenna effects in integrated circuits that avoids the limitations of the prior approaches is highly desirable.

SUMMARY OF THE INVENTION

This and other needs are met by embodiments of the invention, which in one aspect provide a method for updating a data representation of an integrated circuit layout to reduce antenna effects in an integrated circuit based upon the integrated circuit layout. The data representation is analyzed to identify a problem interconnect that satisfies antenna effect criteria. Then a discharge path is assigned to the problem interconnect. Finally, the data representation of the integrated circuit layout is updated to reflect the assignment of the discharge path to the problem interconnect.

According to another aspect of the invention, a computer system is provided for updating a data representation of an integrated circuit layout to reduce antenna effects in an integrated circuit based upon the integrated circuit layout. The computer system comprises one or more processors and a memory coupled to the one or more processors. The memory also contains one or more sequences of one or more instructions which, when executed by the one or more processors, cause the computer system to perform the steps of: analyzing the data representation to identify a problem interconnect that satisfies antenna effect criteria, assigning a discharge path to the problem interconnect, and updating the data representation of the integrated circuit layout to reflect the assignment of the discharge path to the problem interconnect.

According to another aspect of the invention, a method is provided for manufacturing an integrated circuit. First, a plurality of integrated circuit devices are formed in a plurality of layers of material. Then, a patterned metal layer is formed on the plurality of layers of material to provide electrical connections between the plurality of integrated circuit devices, wherein the forming of the patterned metal layer comprises forming a first interconnect that satisfies antenna effect criteria and forming a second interconnect that does not satisfy the antenna effect criteria. Finally, a discharge path is formed between the first interconnect and a ground, wherein the second interconnect is not connected to a discharge path.

According to another aspect of the invention, an integrated circuit is provided. The integrated circuit comprises a plurality of integrated circuit devices formed in a plurality of layers of material, a patterned metal layer on the plurality of layers of material to provide electrical connections between the plurality of integrated circuit devices, wherein the patterned metal layer comprises a first interconnect that satisfies antenna effect criteria and a second interconnect that does not satisfy the antenna effect criteria and a discharge path connected between the first interconnect and the ground, wherein the second interconnect is not connected to a discharge path.

Other aspects and advantages of the invention will become apparent from the following description and claims.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

In the following description, for the purposes of explanation, specific details are set forth in order to provide a thorough understanding of the invention. However, it will be apparent that the invention may be practiced without these specific details. In other instances, well-known structures and devices are depicted in block diagram form in order to avoid unnecessarily obscuring the invention.

FUNCTIONAL OVERVIEW

Figure 1:
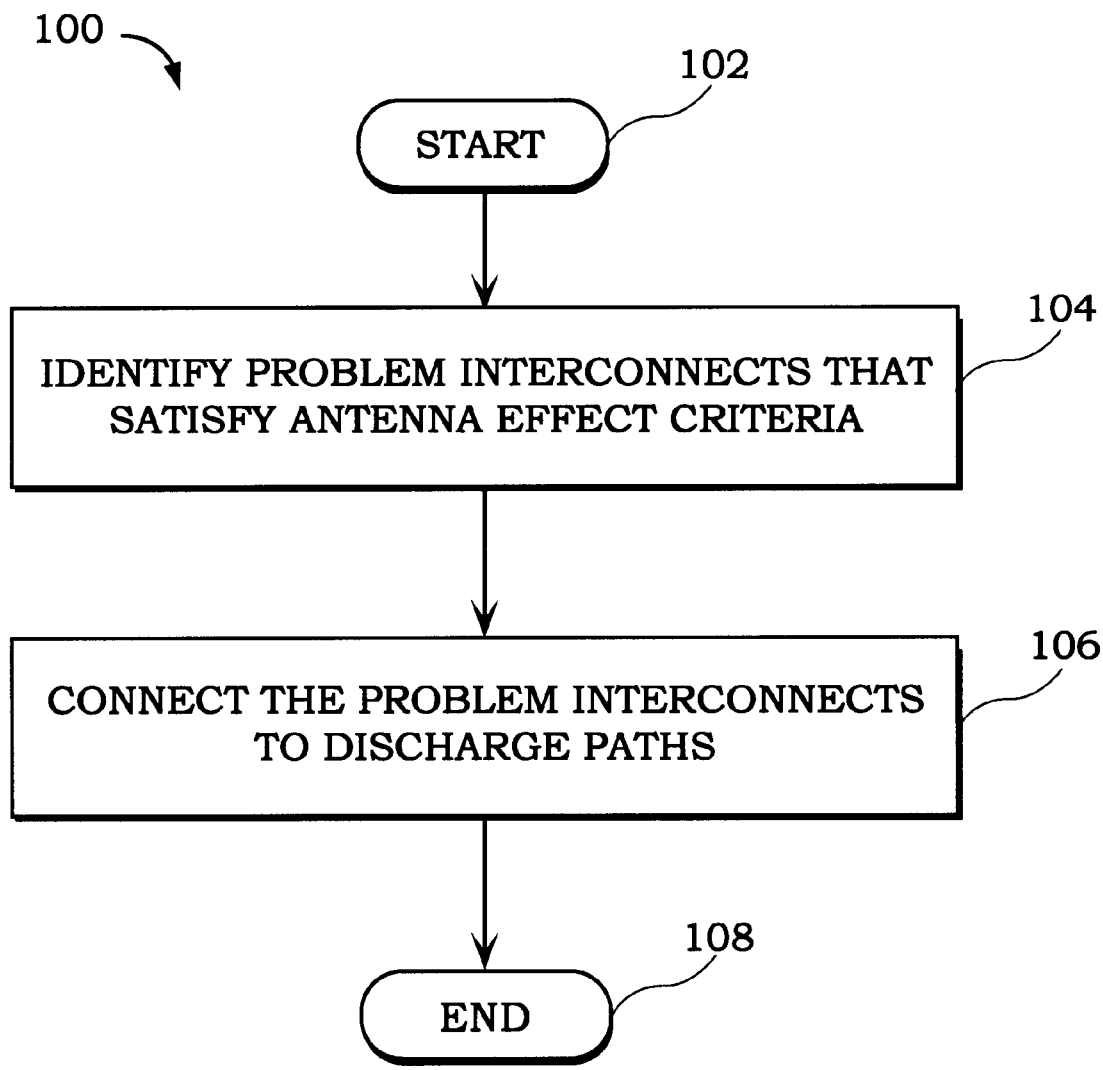
FIG. 1 is a top-level flow chart illustrating an approach for reducing antenna effects in integrated circuits according to an embodiment of the invention.

The present invention is directed to an approach for reducing antenna effects in integrated circuits. FIG. 1 is a top-level flow chart 100 illustrating an approach for reducing antenna effects in integrated circuits according to an embodiment of the invention. After starting in step 102, in step 104, an integrated circuit design is evaluated to identify one or more problem interconnects that satisfy certain antenna effect criteria. Problem interconnects may present an unacceptable risk of damage to a semiconductor device during processing.

In step 106, the problem interconnects are selectively connected to one or more discharge paths and the integrated circuit design is updated to reflect the new connections. The process is complete in step 108. Each of these steps are described in more detail hereinafter. By selectively connecting only the problem interconnects to discharge paths, the impact to an integrated circuit design is minimized relative to prior approaches. More specifically, the number of additional devices that must be added to an integrated circuit design and the amount of re-routing that must be performed may be significantly reduced.

DETAILED DESCRIPTION

Embodiments of the invention are not limited to any particular type of integrated circuit layout or implementation. For example, embodiments of the invention may be used with gate array, standard cell, cell-based array, custom cell implementations or any other type of implementation. Furthermore, embodiments of the invention are not limited to any particular type of semiconductor device.

An approach for reducing antenna effects in integrated circuits according to an embodiment of the invention is now described with reference to FIG. 2 which is a block diagram of a cell arrangement 200. Cell arrangement 200 includes functional cells 202, 204, 206, 208, 210, 212 and 214. As used herein, the term "functional cell" refers to a logical or physical group of semiconductor devices that perform one or more functions. Functional cells 202, 204, 206, 208, 210, 212 and 214 may also contain unused semiconductor devices that may be used to create discharge paths as described herein. Cell arrangement 200 also includes unused sites 216, 218 and 220 that do not contain semiconductor devices, but which may be populated with semiconductor devices to create discharge paths as described herein.

1. Identification of Problem Interconnects

According to an embodiment of the invention, cell arrangement 200 is first evaluated to identify problem interconnects that satisfy antenna effect criteria. Cell arrangement 200 characteristically includes interconnects that connect semiconductor devices both within (intra cell) and between (inter cell) functional cells 202, 204, 206, 208, 210, 212 and 214. The particular antenna effect criteria used depends upon the requirements of a particular application and embodiments of the invention are not limited to particular antenna effect criteria. Examples of antenna effect criteria include the total area of an interconnect and the size of the semiconductor devices connected to the interconnect. The total area of an interconnect is relevant to antenna effects because the amount of charge buildup on an interconnect is related to the area of an interconnect and generally increases as the area of an interconnect increases. The size of the semiconductor devices connected to an interconnect is important because large devices can handle more charge than relatively smaller devices. Thus, for the same size interconnects connected to a large device and a small device, only the interconnect connected to the small device may satisfy the antenna effect criteria. One example of a commercially available software application that may be used to identify interconnects that satisfy antenna effect criteria is Dracula by Cadence Design Systems of San Jose, Calif.

2. Connecting Problem Interconnects to Discharge Paths

Once the problem interconnects have been identified, the problem interconnects are connected to discharge paths to reduce antenna effects during semiconductor processing.

Figure 2:
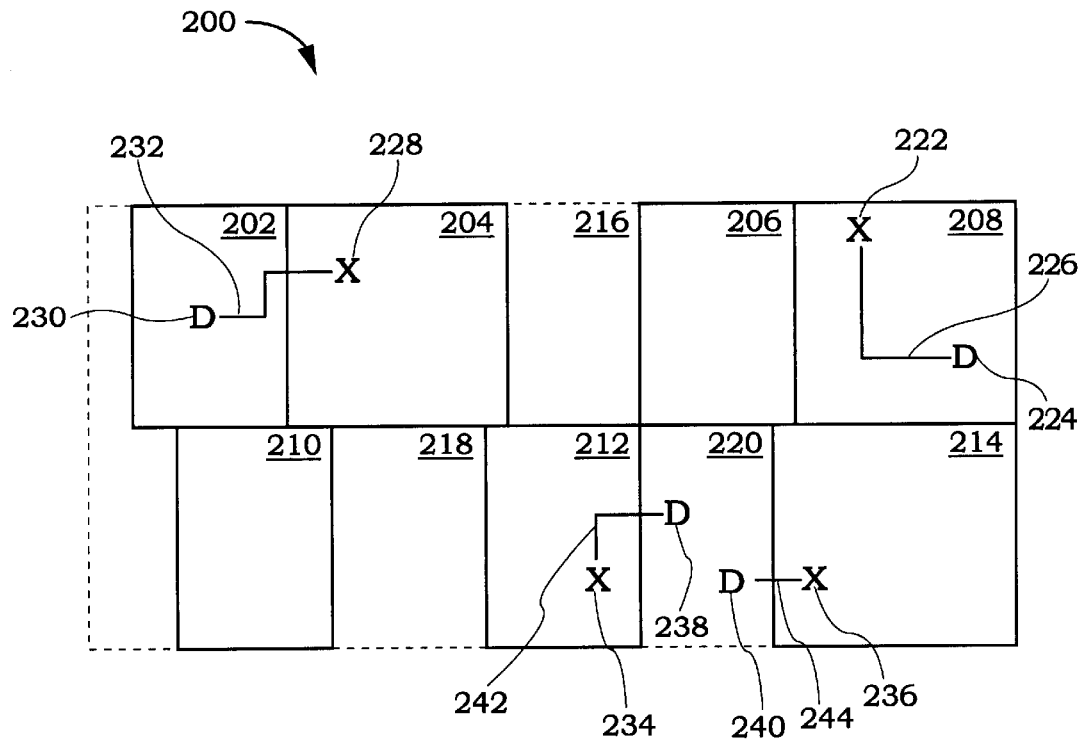
FIG. 2 is a block diagram of a cell arrangement illustrating an approach for reducing antenna effects in integrated circuits according to an embodiment of the invention.

As illustrated in FIG. 2, a problem interconnect 222, designated by an "X", is identified in functional cell 208 and connected to a ground (not illustrated) through a diode 224, designated by a "D", via a connection 226. For gate array or cell-based applications, diode 224 may be created from unused transistors. For standard cell or custom applications, diode 224 typically must be added to functional cell 208. If there is insufficient space in functional cell 208 to add in a transistor, then a transistor must be added elsewhere in cell arrangement 200 as described in more detail hereinafter.

Problem interconnects may also be connected to diodes in other functional cells. For example, a problem interconnect 228 in functional cell 204 is connected to a diode 230 in functional cell 202 via a connection 232. In situations where cell arrangement 200 does not contain a sufficient number of unused transistors to be used as diodes, additional transistors and/or diodes may be added into unused sites 216, 218 and 220. For example, suppose that problem interconnects 234 and 236 require discharge paths and cell arrangement 200 does not contain any available semiconductor devices. In this situation, diodes 238 and 240 are added to unused site 220 and connected to problem interconnects 234 and 236 via connections 242 and 244, respectively.

3. Selecting the "Best" Discharge Path

In some situations there are several candidate diodes in relatively close proximity to a problem interconnect providing several possible discharge paths. In these situations one of the candidate diodes is selected to provide a discharge path for the problem interconnect.

Figure 3:
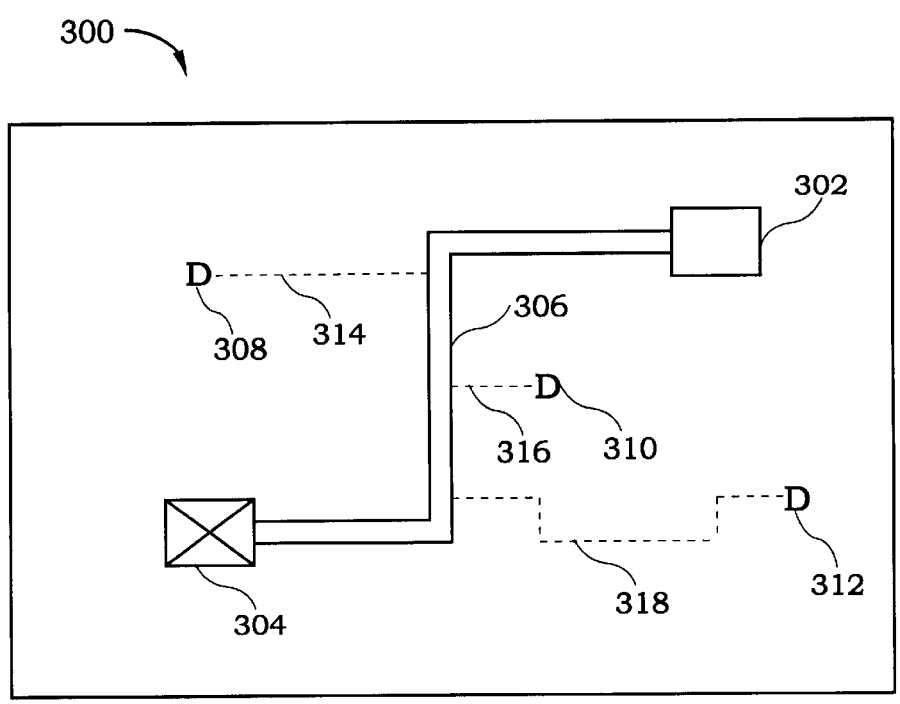
FIG. 3 is a block diagram schematically illustrating a functional cell having a semiconductor device connected to a via by a problem interconnect according to an embodiment of the invention.

The approach for selecting a particular discharge path for a problem interconnect, according to an embodiment of the invention, is now described with reference to FIG. 3. FIG. 3 is a block diagram of a functional cell 300 that includes a semiconductor device 302 connected to a via 304 by a problem interconnect 306. Via 304 provides an electrical connection between semiconductor device 302 and another device on another level (not illustrated).

Functional cell 300 includes candidate diodes 308, 310 and 312 that can be used to provide a discharge path for problem interconnect 306. According to one embodiment of the invention, candidate diodes 308, 310 and 312 are determined by identifying all diodes with interconnection routing paths located on either the same level or a lower level and that are within a predetermined distance of any point on problem interconnect 306. For example, a wavefront type search may be used for this purpose.

According to one embodiment of the invention, problem interconnect 306 is connected to the candidate diode 308, 310 or 312 that best satisfies a cost function. The factors included in the cost function depend upon the requirements of a particular application. According to one embodiment of the invention, the cost function may account for the minimum length of each discharge path through candidate diodes 308, 310 and 312, as well as the number of vias in each discharge path. In determining the length of a particular discharge path, the shortest distance between any portion of problem interconnect 306 and candidate diodes 308, 310 and 312 may be used. Thus, in accordance with the invention, discharge paths are not restricted to being connected to device inputs, but may be connected to any location on a problem interconnect.

It may be important to consider the number of vias required to make a connection because, as previously described, vias can adversely affect the shape or size of an integrated circuit layout and also have associated parasitic capacitances that can adversely affect circuit performance. Thus, a longer discharge path to a first diode on the same level as a problem interconnect may be chosen over a shorter discharge path to a second diode located on a level below the problem interconnect. An example of a cost function is to manage the width and length of a particular interconnect to reduce the total capacitance of the particular interconnect. Another example is to reduce the number of vias on a particular interconnect.

In the present example the shortest routing distance between candidate diodes 308, 310 and 312 and problem interconnect 306, accounting for routing around layout features (not illustrated), is represented by discharge path connections 314, 316 and 318, respectively. Candidate diode 308 may be directly connected to problem interconnect 306 via discharge path connection 314 that is located on the same metal layer as problem interconnect 306. Candidate diode 312 may be connected to problem interconnect 306 via discharge path connection 318. Discharge path connection 318 requires two jogs to route around other layout features (not illustrated). Candidate diode 310 may be connected to problem interconnect 306 via discharge path connection 316. However, discharge path connection 316 must be routed to other metallization levels (not illustrated) using vias because layout features (not illustrated) completely block discharge path connection 316 from being routed from candidate diode 310 to problem interconnect 306 on the same metallization level as problem interconnect 306.

As between candidate diodes 308 and 312, candidate diode 308 is generally preferable since, as illustrated, discharge path connection 314 is shorter than discharge path connection 318 and neither discharge path connection 314 or 318 must be routed to other metallization levels to connect to problem interconnect 306. As between candidate diodes 308 and 310, discharge path connection 316 is shorter than discharge path connection 314. However, since discharge path connection 316 must be routed to other metallization layers, requiring additional vias, the cost attributable to connecting candidate diode 310 to problem interconnect 306 may be greater than the cost to connect candidate diode 308 to problem interconnect 306.

Although the approach for selecting a particular discharge path for a problem interconnect has been described in the context of a single functional cell 300 and intra-cell connections 314, 316 and 318, the approach is applicable to multiple functional cells and cross-functional cell diode connections. Furthermore, embodiments of the invention are applicable to applications that include multiple layers of active components, i.e. transistors and diodes.

Figure 4:
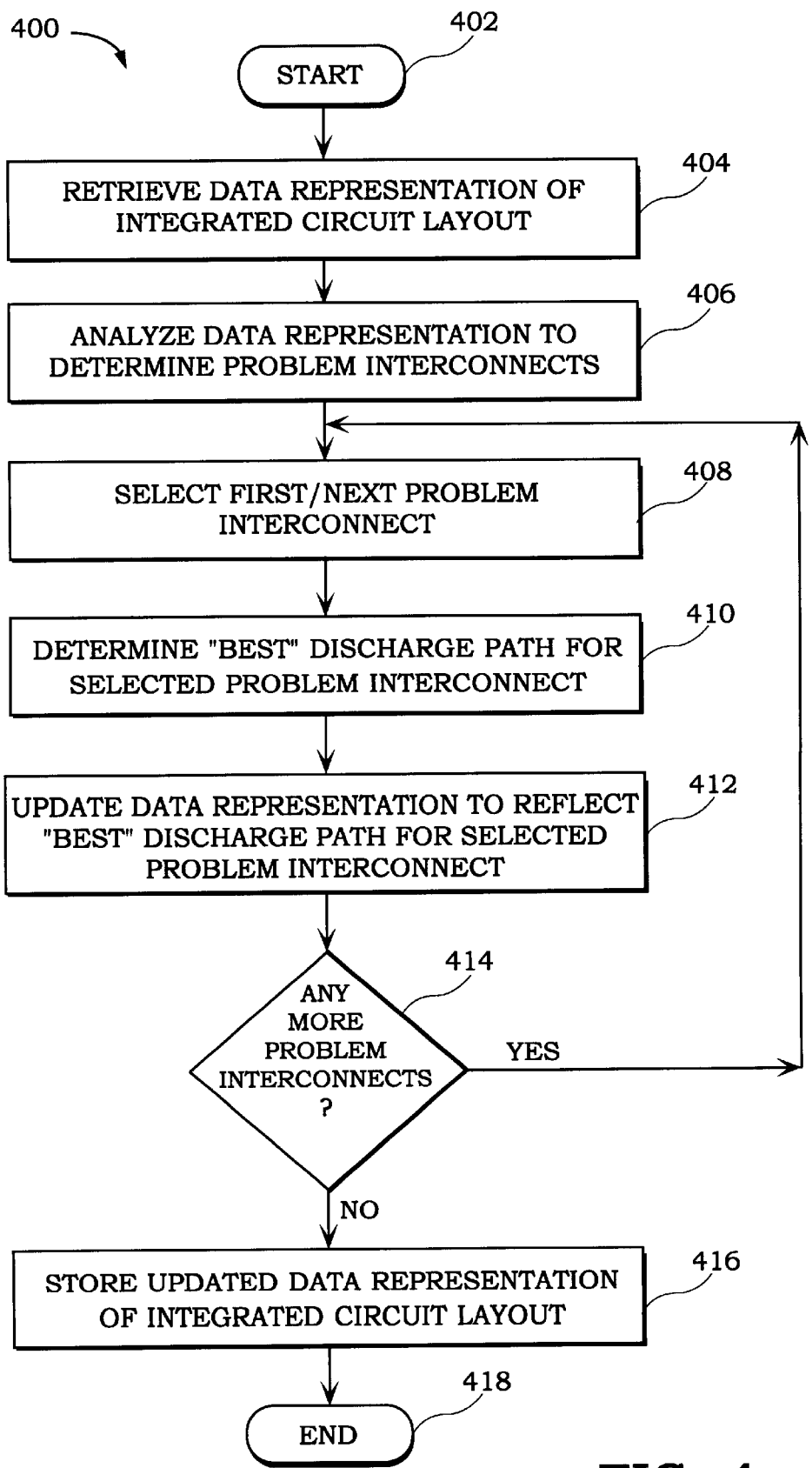
FIG. 4 is a flow chart illustrating an approach for reducing process antenna effects in integrated circuits according to an embodiment of the invention.

The approach for reducing antenna effects in integrated circuits is now described with reference to the flow chart 400 of FIG. 4. After starting in step 402, in step 404, a data representation of an integrated circuit layout is received. In step 406, the data representation is analyzed to determine any problem interconnects that exist in the integrated circuit layout. As previously described, problem interconnects are those interconnects that satisfy certain antenna effect criteria.

In step 408 the first problem interconnect is selected. In step 410 the "best" discharge path is selected for the selected problem interconnect using the cost function as previously described. In step 412 the data representation is updated to reflect the selection of the "best" discharge path for the selected problem interconnect. This includes updating the data representation to reflect the diode used in the discharge path as well as the connection between the diode, the problem interconnect and ground. This may be performed with a router to place the connection.

In step 414 a determination is made as to whether there are any more problem interconnects to be processed. If so, then steps 408 through 412 are repeated until in step 414 a determination is made that there are not more problem interconnects to be processed. Once all of the problem interconnects have been processed, in step 416 the updated data representation of the integrated circuit layout is stored. The process is then complete in step 418.

IMPLEMENTATION MECHANISMS

The approach for reducing antenna effects in integrated circuits described herein may be implemented in hardware circuitry, in computer software or a combination of hardware circuitry and computer software. For example, the approach may be implemented as a stand-alone program or implemented as part of the place and route step of an integrated circuit layout synthesis tool.

Figure 5:
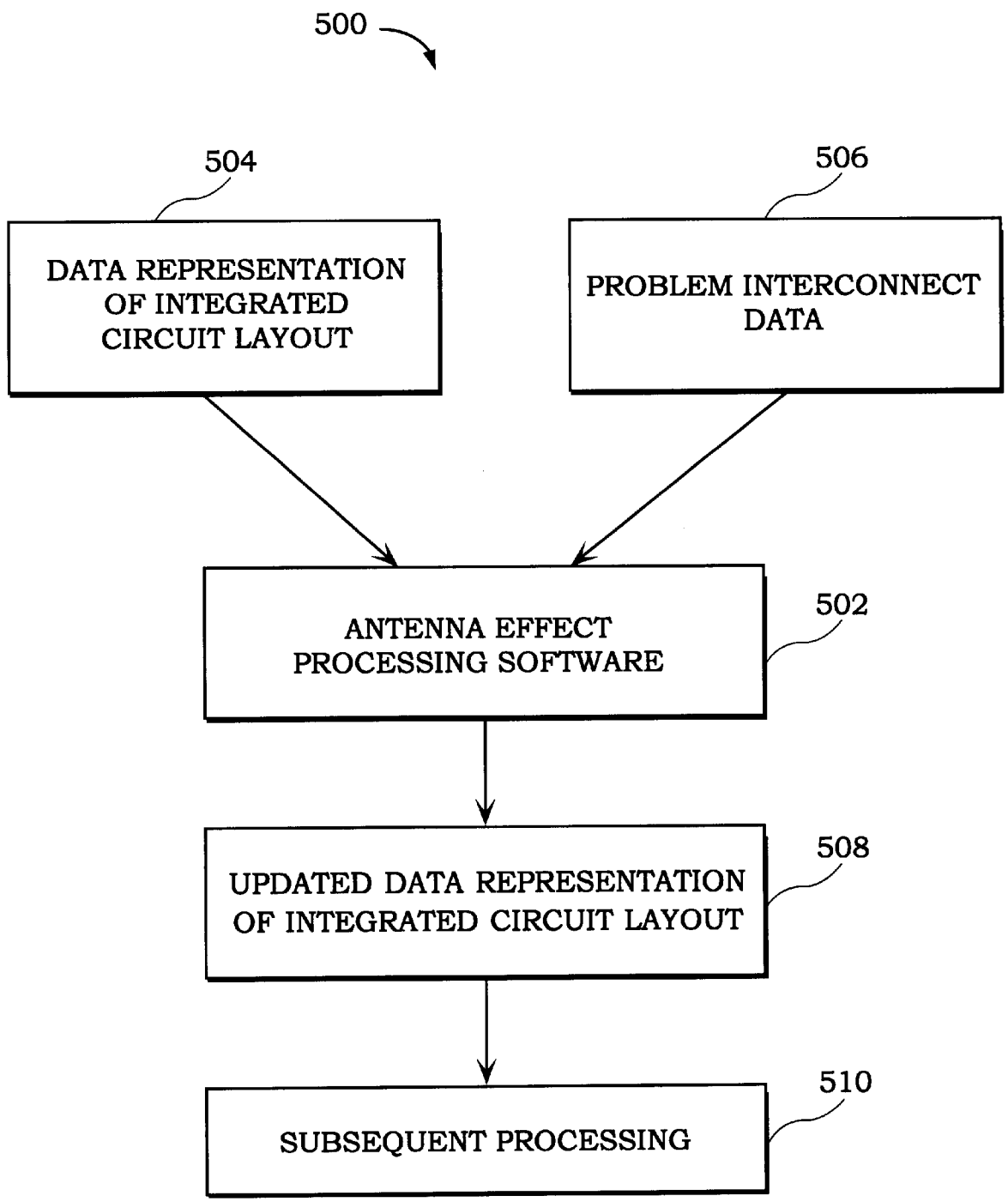
FIG. 5 is a block diagram illustrating the use of a software tool for reducing process antenna effects in integrated circuits according to an embodiment of the invention.

FIG. 5 is a block diagram 500 illustrating the use of a software tool for implementing the approach for reducing antenna effects in an integrated circuit according to an embodiment of the invention. Antenna effect processing software 502 receives a data representation of an integrated circuit layout 504 that may be provided, for example, by a place and route process. The data representation of the integrated circuit layout 504 characteristically specifies the devices, routing and materials included in the integrated circuit layout. Antenna effect processing software 502 also receives problem interconnect data 506 that identifies the problem interconnects contained in the integrated circuit layout. The problem interconnect data 506 may be provided by another process, for example, problem interconnect analysis software such as Dracula, by Cadence Design.

Antenna effect processing software 502 processes both the data representation of the integrated circuit layout 504 and the problem interconnect data 506 in accordance with the approach described herein and generates an updated data representation of the integrated circuit layout 508 that reflects the selective assignment of discharge paths to the problem interconnects in the integrated circuit layout in accordance with embodiments of the invention as described herein. The updated data representation of the integrated circuit layout 508 may be subsequently processed to generate data that can be used by a foundry to fabricate an integrated circuit. For example, the updated data representation of the integrated circuit layout 508 may specify the additional diodes to be used for the discharge path and the connections without specifying the routing. The routing of the new diodes may then be determined during subsequent processing 510 by a place and route process. However, the updated data representation of the integrated circuit 508 may contain all of the information required to fabricate an integrated circuit structure. Thus, subsequent processing as illustrated in block 510 may not be required.

Figure 6:
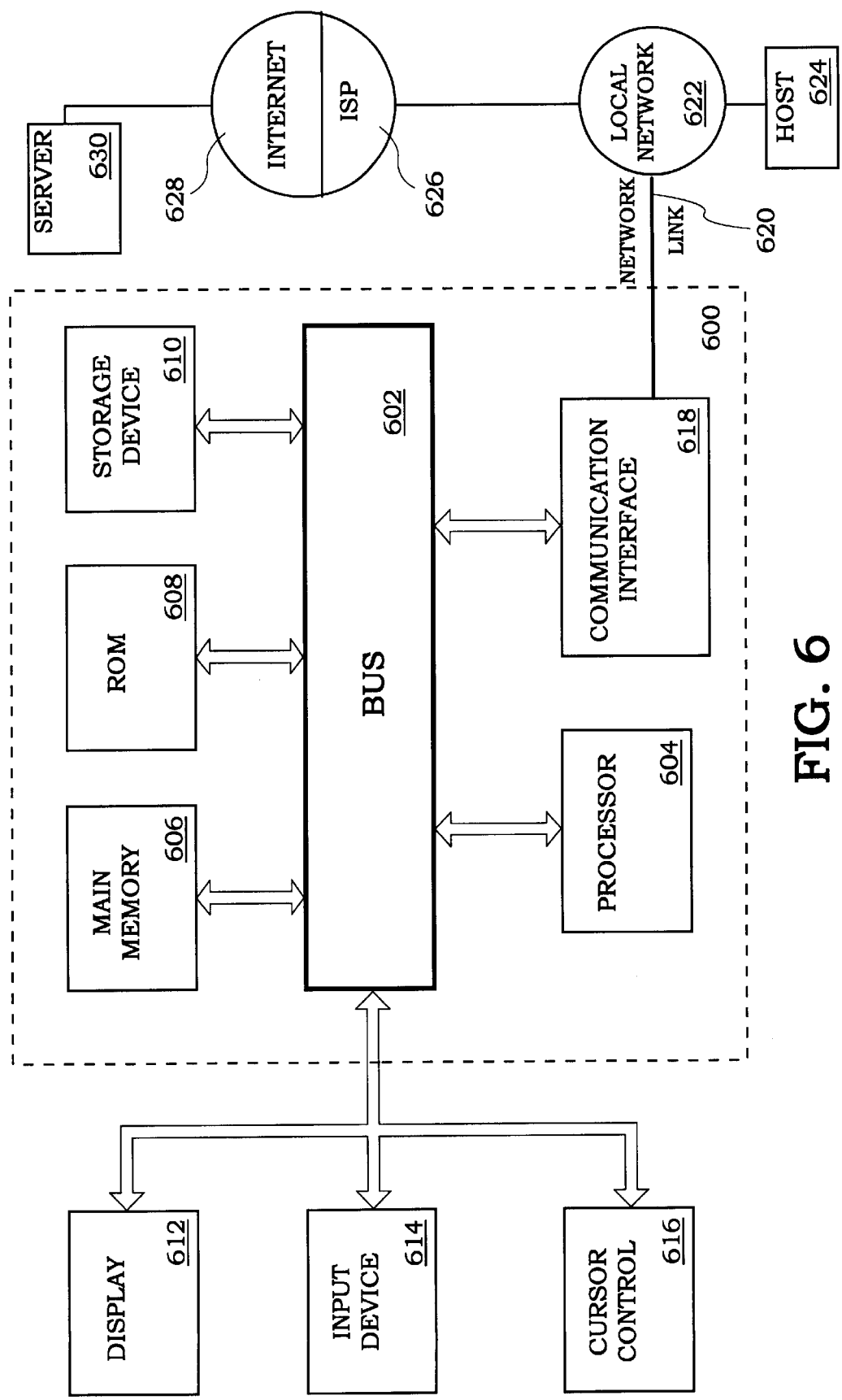
FIG. 6 is a block diagram on which embodiments of the invention may be implemented.

FIG. 6 is a block diagram that illustrates a computer system 600 upon which embodiments of the invention may be implemented. Computer system 600 includes a bus 602 or other communication mechanism for communicating information, and a processor 604 coupled with bus 602 for processing information. Computer system 600 also includes a main memory 606, such as a random access memory (RAM) or other dynamic storage device, coupled to bus 602 for storing information and instructions to be executed by processor 604. Main memory 606 also may be used for storing temporary variables or other intermediate information during execution of instructions to be executed by processor 604. Computer system 600 further includes a read only memory (ROM) 608 or other static storage device coupled to bus 602 for storing static information and instructions for processor 604. A storage device 610, such as a magnetic disk, optical disk, or any other type of non-volatile storage may be provided and coupled to bus 602 for storing information and instructions.

Computer system 600 may be coupled via bus 602 to a display 612, such as a cathode ray tube (CRT), for displaying information to a computer user. An input device 614, including alphanumeric and other keys, is coupled to bus 602 for communicating information and command selections to processor 604. Another type of user input device is cursor control 616, such as a mouse, a trackball, or cursor direction keys for communicating direction information and command selections to processor 604 and for controlling cursor movement on display 612. This input device typically has two degrees of freedom in two axes, a first axis (e.g., x) and a second axis (e.g., y), that allows the device to specify positions in a plane.

The invention is related to the use of computer system 600 for reducing antenna effects in integrated circuits. According to one embodiment of the invention, the reduction of antenna effects in integrated circuits is provided by computer system 600 in response to processor 604 executing one or more sequences of one or more instructions contained in main memory 606. Such instructions may be read into main memory 606 from another computer-readable medium, such as storage device 610. Execution of the sequences of instructions contained in main memory 606 causes processor 604 to perform the process steps described herein. One or more processors in a multi-processing arrangement may also be employed to execute the sequences of instructions contained in main memory 606. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 604 for execution. Such a medium may take many forms, including but not limited to, non-volatile media, volatile media, and transmission media. Non-volatile media includes, for example, optical or magnetic disks, such as storage device 610. Volatile media includes dynamic memory, such as main memory 606. Transmission media includes coaxial cables, copper wire and fiber optics, including the wires that comprise bus 602. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 604 for execution. For example, the instructions may initially be carried on a magnetic disk of a remote computer. The remote computer can load the instructions into its dynamic memory and send the instructions over a telephone line using a modem. A modem local to computer system 600 can receive the data on the telephone line and use an infrared transmitter to convert the data to an infrared signal. An infrared detector coupled to bus 602 can receive the data carried in the infrared signal and place the data on bus 602. Bus 602 carries the data to main memory 606, from which processor 604 retrieves and executes the instructions. The instructions received by main memory 606 may optionally be stored on storage device 610 either before or after execution by processor 604.

Computer system 600 also includes a communication interface 618 coupled to bus 602. Communication interface 618 provides a two-way data communication coupling to a network link 620 that is connected to a local network 622. For example, communication interface 618 may be an integrated services digital network (ISDN) card or a modem to provide a data communication connection to a corresponding type of telephone line. As another example, communication interface 618 may be a local area network (LAN) card to provide a data communication connection to a compatible LAN. Wireless links may also be implemented. In any such implementation, communication interface 618 sends and receives electrical, electromagnetic or optical signals that carry digital data streams representing various types of information.

Network link 620 typically provides data communication through one or more networks to other data devices. For example, network link 620 may provide a connection through local network 622 to a host computer 624 or to data equipment operated by an Internet Service Provider (ISP) 626. ISP 626 in turn provides data communication services through the world wide packet data communication network now commonly referred to as the "Internet" 628. Local network 622 and Internet 628 both use electrical, electromagnetic or optical signals that carry digital data streams. The signals through the various networks and the signals on network link 620 and through communication interface 618, which carry the digital data to and from computer system 600, are exemplary forms of carrier waves transporting the information.

Computer system 600 can send messages and receive data, including program code, through the network(s), network link 620 and communication interface 618. In the Internet example, a server 630 might transmit a requested code for an application program through Internet 628, ISP 626, local network 622 and communication interface 618. In accordance with the invention, one such downloaded application provides for reducing antenna effects in integrated circuits as described herein.

The received code may be executed by processor 604 as it is received, and/or may be stored in storage device 610, or other non-volatile storage for later execution. In this manner, computer system 600 may obtain application code in the form of a carrier wave.

Figure 7:
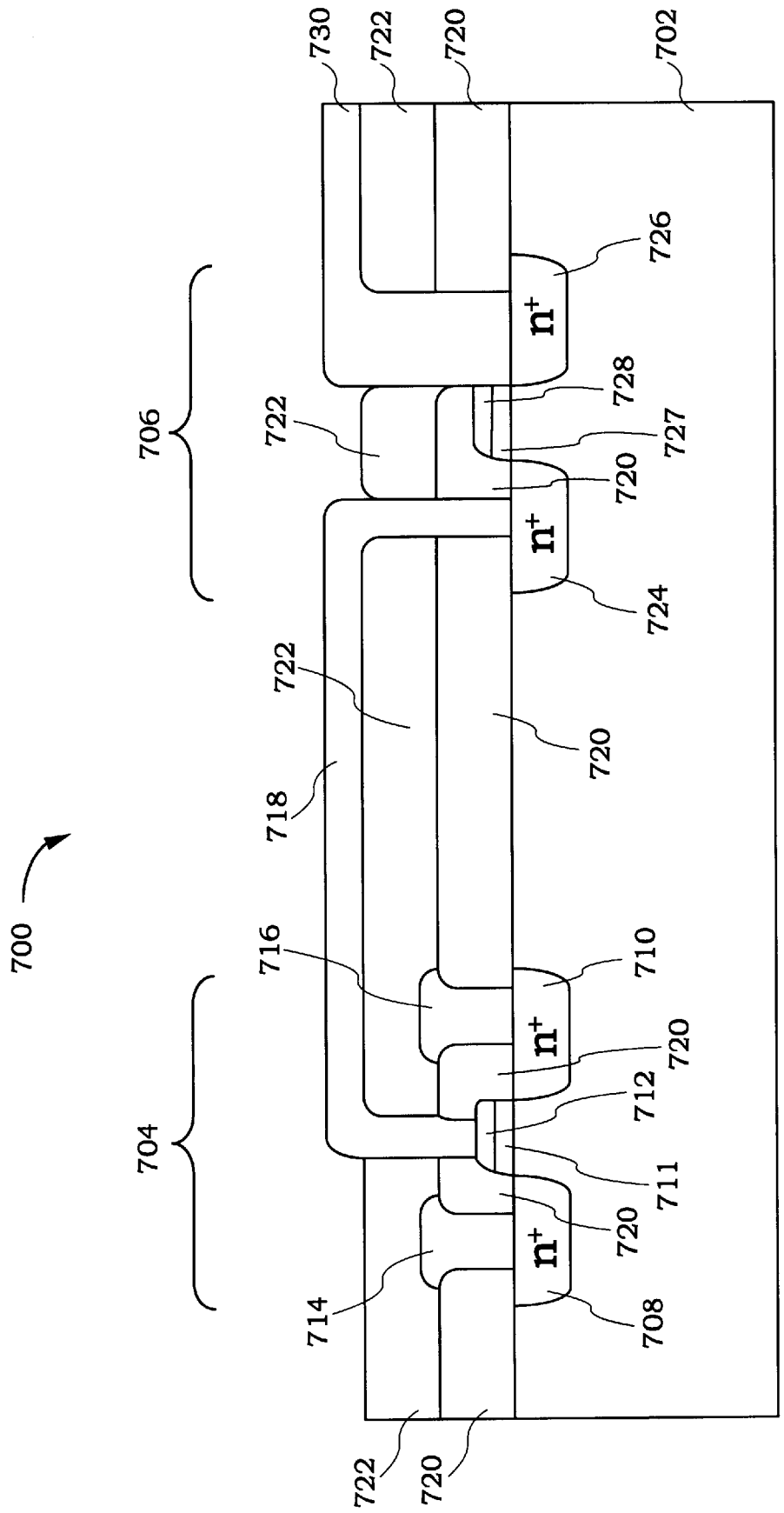
FIG. 7 schematically illustrates a semiconductor structure made in accordance with an embodiment of the invention.

FIG. 7 schematically illustrates a semiconductor structure 700 manufactured according to an embodiment of the invention. Semiconductor structure 700 comprises a substrate 702, typically silicon (Si), in which semiconductor devices, 704 and 706, e.g. transistors, are formed. As is explained in more detail hereinafter, semiconductor devices 704 and 706 represent a transistor and a diode, respectively. As would be well understood by one skilled in the art, transistor 704 includes a source region 708, a drain region 710, a thin oxide 711 and a gate electrode 712. Source region 708 and drain region 710 may be electrically connected to other locations in semiconductor structure 700 through metal connections 714 and 716 respectively. Gate electrode 712 is electronically connected to other locations through a metal interconnect 718. Metal connections 714, 716 and metal interconnect 718, which may be, for example aluminum, copper or any other conductive material, are electronically insulated from each other by dielectric layers 720 and 722, that are typically silicon dioxide.

Diode 706 includes a source region 724, a drain region 726, a thin oxide 727 and a gate electrode 728. Characteristically, gate electrode 728 and drain region 726 of diode 706 are electrically connected together to a ground (not illustrated) through a metal interconnect 730.

In accordance with an embodiment of the invention, during the design of semiconductor structure 700, metal interconnect 718 is determined to be a problem interconnect with respect to transistor 704. That is, metal interconnect 718 has sufficiently large area such that there is a high risk that transistor 704 may be damaged during fabrication because of antenna effects. Therefore, metal interconnect 718 is electrically connected to a ground (not illustrated) through diode 706 to reduce antenna effects on transistor 704 during the formation of metal interconnect 718.

Accordingly, a semiconductor structure 700 manufactured in accordance with an embodiment of the invention may have problem interconnects, such as metal interconnect 718 that are selectively connected to discharge paths, in the present example through diode 706, as well as other interconnects (not illustrated) that are not determined to be problem interconnects and therefore are not connected to discharge paths.

The approach for reducing antenna effects in integrated circuits described herein is applicable to any layers in an integrated circuit. For example, for some applications the discharge paths may be provided only on the first layer of metal. For other applications, discharge paths as described herein might be provided on other layers. In addition, the approach may be used with any type of conductive interconnect, for example polysilicon (polyinterconnect) interconnects or metal interconnects, such as those made from aluminum, copper or any other metal.

The approach described herein for reducing antenna effects in integrated circuits provides several advantages over prior approaches. Specifically, by selectively providing discharge paths for only those interconnect segments that require a discharge path, the likelihood of increasing the size of an integrated circuit to accommodate additional diodes may be reduced. This also reduces the likelihood that other routing will have to be changed. Furthermore, in many situations some cells do not have to be changed, significantly reducing the amount of resources required to make the changes and test the updated integrated circuit design.

Having fully described a preferred embodiment of the invention and various alternatives, those skilled in the art will recognize, given the teachings herein, that numerous alternatives and equivalence exist which do not depart from the invention. It is therefore intended that the invention not be limited by the foregoing description, but only by the appended claims.

What is claimed is:

1. A method for updating a data representation of an integrated circuit layout to reduce antenna effects in an integrated circuit based upon the integrated circuit layout, the method comprising the computer-implemented steps of:

analyzing the data representation to identify a problem interconnect that satisfies antenna effect criteria;

assigning a discharge path to the problem interconnect; and updating the data representation of the integrated circuit layout to reflect the assignment of the discharge path to the problem interconnect.

2. The method as recited in claim 1, wherein the step of analyzing the data representation to identify a problem interconnect that satisfies antenna effect criteria includes identifying one or more interconnects that are connected to one or more integrated circuit devices in the integrated circuit layout, and applying the antenna effect criteria to the one or more interconnects, wherein the antenna effect criteria includes the total area of an interconnect and the size of integrated circuit devices connected to an interconnect.

3. The method as recited in claim 1, wherein the step of assigning a discharge path to the problem interconnect includes identifying one or more candidate discharge paths, applying a cost function to the one or more candidate discharge paths, wherein the cost function takes into account both the length of the candidate discharge paths and the number of vias in the candidate discharge paths, selecting a particular discharge path from the one or more candidate discharge paths based upon applying the cost function to the one or more candidate discharge paths, and assigning the particular discharge path to the problem interconnect.

4. The method as recited in claim 3, wherein each candidate discharge path includes a diode and if there is an insufficient number of diodes, then adding diodes to the integrated circuit layout.

5. The method as recited in claim 3, wherein the step of identifying one or more candidate discharge paths includes identifying one or more diodes located within a predetermined distance of the problem interconnect.

6. The method as recited in claim 5, wherein the length of the candidate discharge paths is determined by determining the shortest possible distance between the one or more diodes and any point on the problem interconnect.

7. The method as recited in claim 1, wherein the discharge path includes a diode, and the step of updating the data representation includes adding the diode to the data representation.

8. A computer-readable medium carrying one or more sequences of one or more instructions for updating a data representation of an integrated circuit layout to reduce antenna effects in an integrated circuit based upon the integrated circuit layout, the one or more sequences of one or more instructions including instructions which, when executed by one or more processors, cause the one or more processors to perform the steps of:

analyzing the data representation to identify a problem interconnect that satisfies antenna effect criteria;

assigning a discharge path to the problem interconnect; and updating the data representation of the integrated circuit layout to reflect the assignment of the discharge path to the problem interconnect.

9. The computer-readable medium as recited in claim 8, wherein the step of analyzing the data representation to identify a problem interconnect that satisfies antenna effect criteria includes identifying one or more interconnects that are connected to one or more integrated circuit devices in the integrated circuit layout, and applying the antenna effect criteria to the one or more interconnects, wherein the antenna effect criteria includes the total area of an interconnect and the size of integrated circuit devices connected to an interconnect.

10. The computer-readable medium as recited in claim 8, wherein the step of assigning a discharge path to the problem interconnect includes identifying one or more candidate discharge paths, applying a cost function to the one or more candidate discharge paths, wherein the cost function takes into account both the length of the candidate discharge paths and the number of vias in the candidate discharge paths, selecting a particular discharge path from the one or more candidate discharge paths based upon applying the cost function to the one or more candidate discharge paths, and assigning the particular discharge path to the problem interconnect.

11. The computer-readable medium as recited in claim 10, wherein each candidate discharge path includes a diode and if there is an insufficient number of diodes, then adding diodes to the integrated circuit layout.

12. The computer-readable medium as recited in claim 10, wherein the step of identifying one or more candidate discharge paths includes identifying one or more diodes located within a predetermined distance of the problem interconnect.

13. The computer-readable medium as recited in claim 12, wherein the length of the candidate discharge paths is determined by determining the shortest possible distance between the one or more diodes and any point on the problem interconnect.

14. The computer-readable medium as recited in claim 8, wherein
the discharge path includes a diode, and
the step of updating the data representation includes adding the diode to the data representation.

15. A computer system for updating a data representation of an integrated circuit layout to reduce antenna effects in an integrated circuit based upon the integrated circuit layout, the computer system comprising:
one or more processors; and
a memory coupled to the one or more processors and containing one or more sequences of one or more instructions which, when executed by the one or more processors, cause the computer system to perform the steps of:
analyzing the data representation to identify a problem interconnect that satisfies antenna effect criteria,
assigning a discharge path to the problem interconnect, and
updating the data representation of the integrated circuit layout to reflect the assignment of the discharge path to the problem interconnect.

16. The computer system as recited in claim 15, wherein the step of analyzing the data representation to identify a problem interconnect that satisfies antenna effect criteria includes
identifying one or more interconnects that are connected to one or more integrated circuit devices in the integrated circuit layout, and
applying the antenna effect criteria to the one or more interconnects, wherein the antenna effect criteria includes the total area of an interconnect and the size of integrated circuit devices connected to an interconnect.

17. The computer system as recited in claim 15, wherein the step of assigning a discharge path to the problem interconnect includes
identifying one or more candidate discharge paths,
applying a cost function to the one or more candidate discharge paths, wherein the cost function takes into account both the length of the candidate discharge paths and the number of vias in the candidate discharge paths,
selecting a particular discharge path from the one or more candidate discharge paths based upon applying the cost function to the one or more candidate discharge paths, and
assigning the particular discharge path to the problem interconnect.

18. The computer system as recited in claim 17, wherein each candidate discharge path includes a diode and if there is an insufficient number of diodes, then adding diodes to the integrated circuit layout.

19. The computer system as recited in claim 17, wherein the step of identifying one or more candidate discharge paths includes identifying one or more diodes located within a predetermined distance of the problem interconnect.

20. The computer system as recited in claim 19, wherein the length of the candidate discharge paths is determined by determining the shortest possible distance between the one or more diodes and any point on the problem interconnect.

21. The computer system as recited in claim 15, wherein
the discharge path includes a diode, and
the step of updating the data representation includes adding the diode to the data representation.

22. A method for manufacturing an integrated circuit, the method comprising the steps of:
forming a plurality of integrated circuit devices in a plurality of layers of material;
forming a patterned metal layer on the plurality of layers of material to provide electrical connections between the plurality of integrated circuit devices, wherein forming the patterned metal layer comprises
forming a first interconnect that satisfies antenna effect criteria, and
forming a second interconnect that does not satisfy the antenna effect criteria; and
forming a discharge path between the first interconnect and a ground,
wherein the second interconnect is not connected to a discharge path.

23. The method as recited in claim 22, wherein the step of forming a discharge path between the first interconnect and a ground includes connecting a diode between the first interconnect and a ground.

24. The method as recited in claim 23, wherein the step of forming a discharge path is performed based upon a cost function that takes into account discharge path length and the number of vias in the discharge path.

25. The method as recited in claim 22, wherein the antenna effect criteria includes interconnect area and the size of an associated integrated circuit device of the plurality of integrated circuit devices and the step of forming a first interconnect that satisfies antenna effect criteria includes forming a first interconnect to a first integrated circuit device of the plurality of the integrated circuit devices that satisfies the antenna effect criteria.

26. An integrated circuit comprising:
a plurality of integrated circuit devices formed in a plurality of layers of material;
a patterned metal layer on the plurality of layers of material to provide electrical connections between the plurality of integrated circuit devices, the patterned metal layer comprising
a first interconnect that satisfies antenna effect criteria, and a second interconnect that does not satisfy the antenna effect criteria; and a discharge path connected between the first interconnect and a ground, wherein the second interconnect is not connected to a discharge path.

27. The integrated circuit as recited in claim 26, wherein the discharge path includes a diode.

28. The integrated circuit as recited in claim 27, wherein the discharge path is selected based upon a cost function that takes into account discharge path length and the number of vias in the discharge path.

29. The integrated circuit as recited in claim 26, wherein the first interconnect is connected to a particular integrated circuit device of the plurality of integrated circuit devices and the antenna effect criteria includes interconnect area and the size of the particular integrated circuit device of the plurality of integrated circuit devices.

30. A system for updating a data representation of an integrated circuit layout to reduce antenna effects in an integrated circuit based upon the integrated circuit layout, the system comprising:

analyzing means for analyzing the data representation to identify a problem interconnect that satisfies antenna effect criteria;

assignment means for assigning a discharge path to the problem interconnect; and update means for updating the data representation of the integrated circuit layout to reflect the assignment of the discharge path to the problem interconnect.

31. The system as recited in claim 30, wherein the analyzing means is further configured to identify one or more interconnects that are connected to one or more integrated circuit devices in the integrated circuit layout, and apply the antenna effect criteria to the one or more interconnects, wherein the antenna effect criteria includes the total area of an interconnect and the size of integrated circuit devices connected to an interconnect.

32. The system as recited in claim 30, wherein the assignment means is further configured to identify one or more candidate discharge paths, apply a cost function to the one or more candidate discharge paths, wherein the cost function takes into account both the length of the candidate discharge paths and the number of vias in the candidate discharge paths, and select one of the one or more candidate discharge paths based upon the results of applying the cost function to the one or more candidate discharge paths.

33. The system as recited in claim 32, wherein each candidate discharge path includes a diode and the assignment means is further configured to determine if there is an insufficient number of diodes and if so, to add diodes to the integrated circuit layout.

34. The system as recited in claim 32, wherein the assignment means is further configured to identify one or more diodes located within a predetermined distance of the problem interconnect.

35. The system as recited in claim 34, wherein the assignment means is further configured to determine the shortest possible distance between the one or more diodes and any point on the problem interconnect.

36. The system as recited in claim 30, wherein the discharge path includes a diode, and the update means is further configured to add the diode to the data representation.

* * * * *